(12) United States Patent
Nishizawa

(10) Patent No.: US 10,950,567 B2
(45) Date of Patent: Mar. 16, 2021

(54) HOLLOW SEALED DEVICE AND MANUFACTURING METHOD THEREFOR

(71) Applicant: Mitsubishi Electric Corporation, Tokyo (JP)

(72) Inventor: Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/473,504

(22) PCT Filed: Mar. 29, 2017

(86) PCT No.: PCT/JP2017/012965
§ 371 (c)(1),
(2) Date: Jun. 25, 2019

(87) PCT Pub. No.: WO2018/179153
PCT Pub. Date: Oct. 4, 2018

(65) Prior Publication Data
US 2020/0144210 A1    May 7, 2020

(51) Int. Cl.
*H01L 23/00* (2006.01)
*H01L 23/02* (2006.01)
(Continued)

(52) U.S. Cl.
CPC .............. *H01L 24/13* (2013.01); *H01L 23/02* (2013.01); *H01L 23/04* (2013.01); *H01L 23/10* (2013.01);
(Continued)

(58) Field of Classification Search
CPC .......... B81C 1/00269; B81C 2203/019; H01L 23/02; H01L 23/04; H01L 23/10; H01L 24/13; H01L 24/80
See application file for complete search history.

(56) References Cited

U.S. PATENT DOCUMENTS 7,259,032 B2 * 8/2007 Murata .................... H01L 24/97
257/684
8,692,390 B2 * 4/2014 Wu ........................ H01L 23/295
257/778

(Continued)

FOREIGN PATENT DOCUMENTS

CN          107924881 A      4/2018
JP          2003-188206 A    7/2003
(Continued)

OTHER PUBLICATIONS

Machine translation, Aihara, Japanese Pat. Pub. No. 2003-188206, translation date: Jul. 6, 2020, Espacenet, all pages. (Year: 2020).*

(Continued)

*Primary Examiner* — Victoria K. Hall
(74) *Attorney, Agent, or Firm* — Studebaker & Brackett PC

(57) ABSTRACT

A ring-like sealing frame (3) and a bump (4) are simultaneously formed on a main surface of a first substrate (1) by patterning a metal paste. A ring-like protrusion (8) having a smaller width than a width of the sealing frame (3) is formed on a main surface of a second substrate (5). The main surface of the first substrate (1) and the main surface of the second substrate (5) are aligned to face each other. The sealing frame (3) is bonded to the protrusion (8), and the bump (4) is electrically bonded to the second substrate (5). A height of the protrusion (8) is 0.4 to 0.7 times a distance between the first substrate (1) and the second substrate (2) after bonding.

8 Claims, 10 Drawing Sheets

(51) Int. Cl.
*H01L 23/10* (2006.01)
*B81C 1/00* (2006.01)
*H01L 23/04* (2006.01)

(52) U.S. Cl.
CPC .......... *H01L 24/80* (2013.01); *B81C 1/00269* (2013.01); *B81C 2203/019* (2013.01)

(56) References Cited

U.S. PATENT DOCUMENTS

| | | | | |
|---|---|---|---|---|
| 2004/0113215 | A1* | 6/2004 | Shimada | H03H 9/059 257/414 |
| 2006/0115323 | A1* | 6/2006 | Coppeta | A61K 9/0097 403/270 |
| 2006/0170089 | A1 | 8/2006 | Mizukoshi | |
| 2007/0228559 | A1* | 10/2007 | Tsuruko | H01L 21/4867 257/734 |
| 2010/0059244 | A1* | 3/2010 | Ishii | H01L 24/11 174/50.5 |
| 2010/0221414 | A1 | 9/2010 | Furuta et al. | |
| 2011/0074047 | A1* | 3/2011 | Pendse | H01L 24/11 257/782 |
| 2011/0132655 | A1* | 6/2011 | Horiguchi | H03H 9/105 174/520 |
| 2011/0132656 | A1* | 6/2011 | Horiguchi | B32B 15/018 174/520 |
| 2013/0187245 | A1* | 7/2013 | Chien | B81C 1/00269 257/415 |
| 2014/0124899 | A1* | 5/2014 | Gooch | H01L 23/053 257/620 |
| 2014/0339710 | A1* | 11/2014 | Fujiwara | H01L 24/05 257/783 |
| 2015/0048509 | A1* | 2/2015 | Nagarajan | H01L 25/0657 257/751 |
| 2015/0298968 | A1* | 10/2015 | Lushan | B81B 7/0058 257/415 |
| 2015/0353347 | A1* | 12/2015 | Schelling | B81C 1/00293 257/414 |
| 2015/0353349 | A1* | 12/2015 | Hattass | B81B 7/007 257/415 |
| 2016/0195970 | A1* | 7/2016 | Choi | G06F 3/044 345/174 |
| 2016/0225694 | A1* | 8/2016 | Barth | H01L 23/481 |
| 2017/0221790 | A1* | 8/2017 | Tomie | H01L 23/367 |
| 2018/0044175 | A1* | 2/2018 | Ogashiwa | H01L 23/02 |
| 2018/0138132 | A1 | 5/2018 | Nishizawa et al. | |
| 2019/0031502 | A1* | 1/2019 | Chidambaram | B81C 1/00269 |
| 2019/0074234 | A1* | 3/2019 | Oka | C03C 8/24 |

FOREIGN PATENT DOCUMENTS

| | | |
|---|---|---|
| JP | 2003-188294 A | 7/2003 |
| JP | 2004-207674 A | 7/2004 |
| JP | 2006-210756 A | 8/2006 |
| JP | 2009-278562 A | 11/2009 |
| JP | 2010-206169 A | 9/2010 |
| JP | 2014-22699 A | 2/2014 |
| JP | 2014-82336 A | 5/2014 |
| JP | 2016-181555 A | 10/2016 |
| JP | 2016-197664 A | 11/2016 |
| WO | 2008/108413 A1 | 9/2008 |
| WO | 2018/078680 A1 | 5/2018 |

OTHER PUBLICATIONS

Machine translation, Nagano, Japanese Pat. Pub. No. 2009-278562, translation date: Kuly 6, 2020, Espacenet, all pages. (Year: 2020).*
International Search Report; Written Opinion; and Notification of Transmittal of the International Search Report and the Written Opinion of the International Searching Authority, or the Declaration issued in PCT/JP2017/012965; dated Jun. 13, 2017.
Toshinori Ogashiwa, et al., Hermetic Seal Bonding at Low-temperature with Sub-micron Gold Particles for Wafer Level Packaging, IMAPS 2015 Orlando—48th Annual International Symposium on Microelectronics, Oct. 26-29, 2015, pp. 73-78, Orlando, Florida, USA.
Hiroyuki Ishida, et al., Surface Compliant Bonding Properties of Low-Temperature Wafer Bonding using Sub-Micron Au Particles, 2013 IEEE Electronic Components & Technology Conference, May 28-31, 2013, pp. 1519-1523.
An Office Action; "Notification of Reasons for Refusal," mailed by the Japanese Patent Office dated Aug. 8, 2017, which corresponds to Japanese Patent Application No. 2017-536598; with English language translation.

* cited by examiner

HOLLOW SEALED DEVICE AND MANUFACTURING METHOD THEREFOR

FIELD

The present invention relates to a hollow sealed device including a cavity between two substrates and a manufacturing method therefor.

BACKGROUND

For better reliability and characteristics, some mounting methods involve cavity sealing wherein semiconductor devices or MEMS (Micro Electric Mechanical Systems) devices are sealed in a cavity formed between opposing substrates (see, for example, PTL 1 and PTL 2). In the conventional device, two substrates are bonded together with a sealing frame to form an airtight cavity, and electrodes of a circuit in the lower substrate are extracted to the upper substrate (see, for example, PTL 1). When fabricating this structure in wafer processes, bumps and a sealing flame are simultaneously formed by patterning a metal paste so that they are collectively bonded. This method allows collective fabrication of a multiplicity of devices by Wafer Level Chip Scale Package (WLCSP) and has found wider applications in recent years.

One drawback is that fine control of pattern width is difficult because of the poor patterning precision of metal paste. The bonding pattern inevitably has a large area, because of which the pressure applied for the bonding (total load divided by pattern area) is insufficient and sealing properties are unsatisfactory. When an airtight seal is to be provided with an Au metal paste, for example, a pressure of 100 MPa or more is necessary for the bonding. When 5000 chips are simultaneously sealed with 4-inch wafers, a sealing frame of 20 μm width would take up about 10% of the pattern area. To secure a bonding pressure of 100 MPa under this condition, a calculated load of 78.5 kN per wafer would be necessary. Since the upper limit of pressure applicable by an existing pressure application apparatus is about 60 kN, an airtight seal cannot be formed. As a solution to this problem, there has been a method wherein a ring-like protrusion is provided in a portion to be bonded to the sealing frame to allow pressure to be concentrated (see, for example, PTL 1).

CITATION LIST

Patent Literature

[PTL1] Japanese Patent Application Laid-open No. 2014-22699
[PTL2] Japanese Patent Application Laid-open No. 2003-188294
[PTL3] Japanese Patent Application Laid-open No. 2016-197664

SUMMARY

Technical Problem

The problem, however, was that applying the method of providing a protrusion in a portion to be bonded to the sealing frame to structures that use bumps would lead to an even poorer airtightness because of bad load distribution to the bumps. For example, when 5000 chips of the same size are fabricated from 4-inch wafers, each chip requiring six bumps of 100 μm diameter, the bumps would take up about 12% of the pattern area. To apply a pressure of 100 MPa under this condition, a calculated load of 94.2 kN would be necessary for the bump pattern alone, even with the protrusion provided in a portion to be bonded to the sealing frame. Accordingly, an airtight seal could not be formed with an existing pressure application apparatus having a maximum capability of 60 kN.

The present invention was made to solve the problems described above and its object is to provide a hollow sealed device and a manufacturing method therefor, whereby, while substrates are electrically connected by bumps, the sealing properties can be improved.

Solution to Problem

A method for manufacturing a hollow sealed device according to the present invention includes: forming a ring-like sealing frame and a bump simultaneously on a main surface of a first substrate by patterning a metal paste; forming a ring-like protrusion having a smaller width than a width of the sealing frame on a main surface of a second substrate; and aligning the main surface of the first substrate and the main surface of the second substrate to face each other, bonding the sealing frame to the protrusion, and electrically bonding the bump to the second substrate, wherein a height of the protrusion is 0.4 to 0.7 times a distance between the first substrate and the second substrate after bonding

Advantageous Effects of Invention

In the present invention, the substrates can be electrically connected by the bump. During the bonding, high pressure can be applied selectively and locally to the protrusion rather than to the entire pattern area of the sealing frame. Thus, a higher load can be applied. The height of the protrusion is 0.4 to 0.7 times the distance between the first substrate and the second substrate after bonding Thus the metal paste of the sealing frame can be transformed to bulk metal directly below the protrusion so that the sealing properties can be improved.

DESCRIPTION OF EMBODIMENTS

A hollow sealed device and a manufacturing method therefor according to the embodiments of the present invention will be described with reference to the drawings. The same components will be denoted by the same symbols, and the repeated description thereof may be omitted.

Embodiment 1

Figure 1:
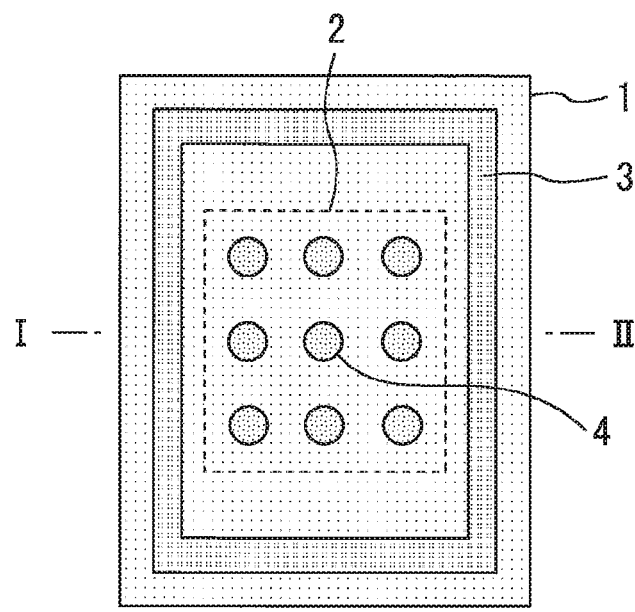
FIG. 1 is a plan view illustrating a method for manufacturing a hollow sealed device according to Embodiment 1 of the present invention.
Figure 2:
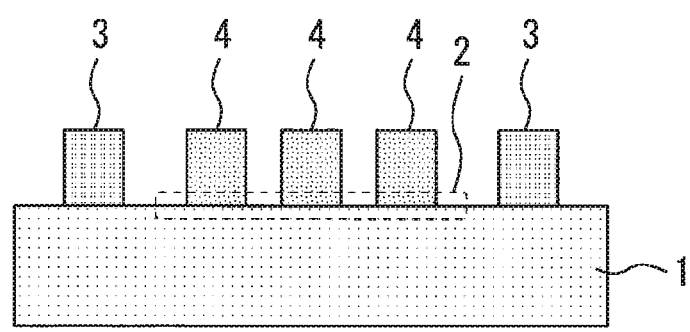
FIG. 2 is a cross-sectional view illustrating the method for manufacturing the hollow sealed device according to Embodiment 1 of the present invention.
Figure 3:
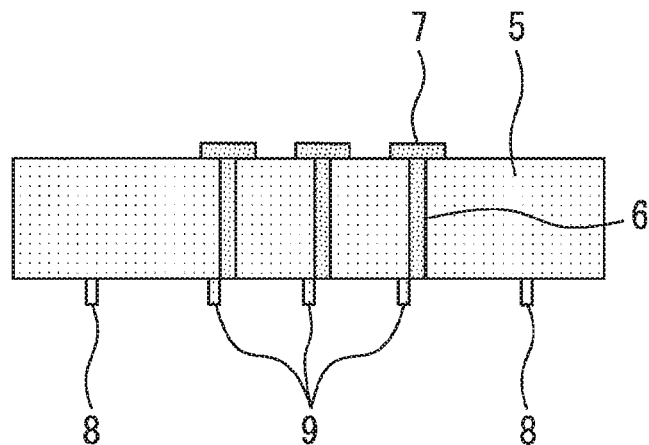
FIG. 3 is a cross-sectional view illustrating the method for manufacturing the hollow sealed device according to Embodiment 1 of the present invention.
Figure 4:
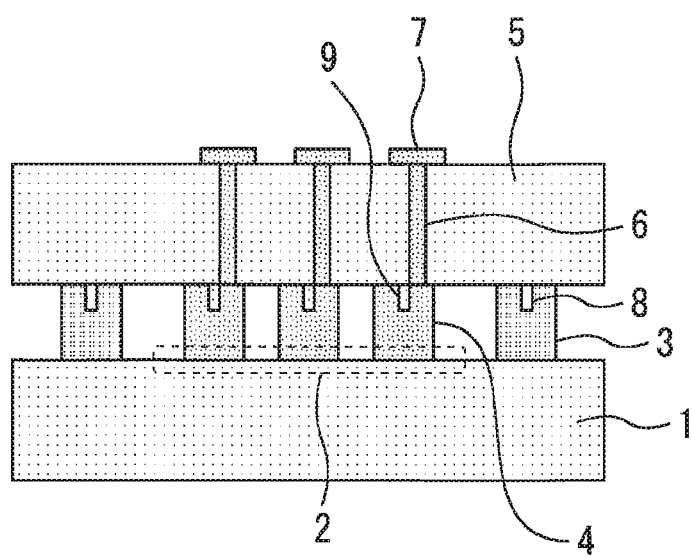
FIG. 4 is a cross-sectional view illustrating the method for manufacturing the hollow sealed device according to Embodiment 1 of the present invention.

FIG. 1 is a plan view illustrating a method for manufacturing a hollow sealed device according to Embodiment 1 of the present invention. FIG. 2 to FIG. 4 are cross-sectional views illustrating the method for manufacturing the hollow sealed device according to Embodiment 1 of the present invention. FIG. 2 is a cross-sectional view taken along I-II of FIG. 1.

First, as shown in FIG. 1 and FIG. 2, a device circuit 2 to be sealed in a cavity is formed in a central portion on an upper surface of a substrate 1. A ring-like sealing frame 3 and bumps 4 are simultaneously formed on the upper surface of the substrate 1 by patterning a metal paste. The sealing frame 3 and the bumps 4 have the same thickness.

A pattern of the sealing frame 3 and bumps 4 can be formed, for example, by first providing a resist pattern, which is removed later using a remover or the like, after recessed shapes in the pattern have been filled with the paste material. Alternatively, the pattern may be formed directly by an inkjet process. The pattern height differs depending on characteristics requirements of the device. The larger the pattern height, the higher the airtightness reliability because of the wider space. On the other hand, the resist will need to be thicker for higher patterns, which leads to deterioration of pattern precision and height uniformity, and therefore an appropriate height has to be selected to make a trade-off. The pattern height here is about 20 µm, for example.

Next, as shown in FIG. 3, vias 6 extending through a counter substrate 5 are formed, and lead-out electrodes 7 connected to the vias 6 are formed on an upper surface of the counter substrate 5. A ring-like protrusion 8 is formed on a lower surface of the counter substrate 5 at the position opposite the sealing frame 3 of the substrate 1. Protrusions 9 are formed on the lower surface of the counter substrate 5 at the positions opposite the bumps 4 of the substrate 1. The protrusion 8 has a smaller width than that of the sealing frame 3. The protrusions 9 have a smaller width than that of the bumps 4. The protrusions 8 and 9 are formed for example by subjecting the lower surface of the counter substrate 5 to dry etching or wet etching, using a resist or metal as a mask. Alternatively, the protrusions 8 and 9 may be formed from a vapor-deposited metal film or plated film.

Next, the temperature is raised to volatilize most of the solvent in the metal paste, after which the upper surface of the substrate 1 and the lower surface of the counter substrate 5 are aligned to face each other as shown in FIG. 4 and both substrates are bonded together under high temperature and pressure. During this process, the sealing frame 3 and protrusion 8 are bonded together, and the bumps 4 and protrusions 9 are bonded together, as well as the bumps 4 are electrically bonded to the vias 6 of the counter substrate 5.

When bonded to the protrusions 8 and 9, the metal microparticles of the sealing frame 3 and bumps 4 are compressed, and adjacent microparticles join each other and agglomerate into bulk metal. The metal paste pattern surrounding the protrusions 8 and 9 is deformed, too, whereby the sealing frame 3 and bumps 4 adhere to the lower surface of the counter substrate 5. The hollow sealed device is thus fabricated.

Electrical signals are input and output between the device circuit 2 and outside of the hollow sealed device thus fabricated via the bumps 4, vias 6, and lead-out electrodes 7. The device circuit 2, vias 6 and so on may be formed on either or both of the substrate 1 and the counter substrate 5, or on both upper and lower surfaces of the substrates.

Figure 5:
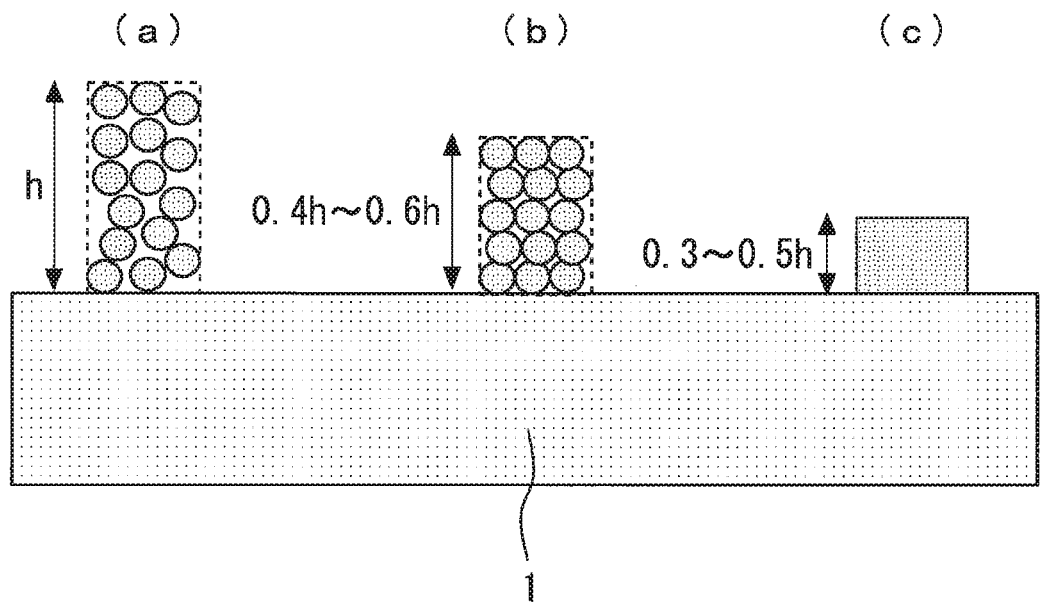
FIG. 5 is a cross-sectional view illustrating state transitions of the metal paste pattern as it deforms under pressure.

FIG. 5 is a cross-sectional view illustrating state transitions of the metal paste pattern as it deforms under pressure. When the metal paste pattern is formed (a), gaps between metal particles are connected to each other (open-cell). As pressure is applied (b), metal particles are pressed together so that adjacent particles start to join each other and the gaps become isolated (closed-cell). When the metal turns completely into bulk (c), it no longer deforms. Relative to the pattern height h in (a), the height in phase (b) is about 0.4h to 0.6h, and the height in phase (c) is about 0.3h to 0.5h. In order to secure airtightness of the cavity, the state of (b) or (c) is necessary, since the air must not be allowed to pass through the sealing frame 3.

Figure 6:
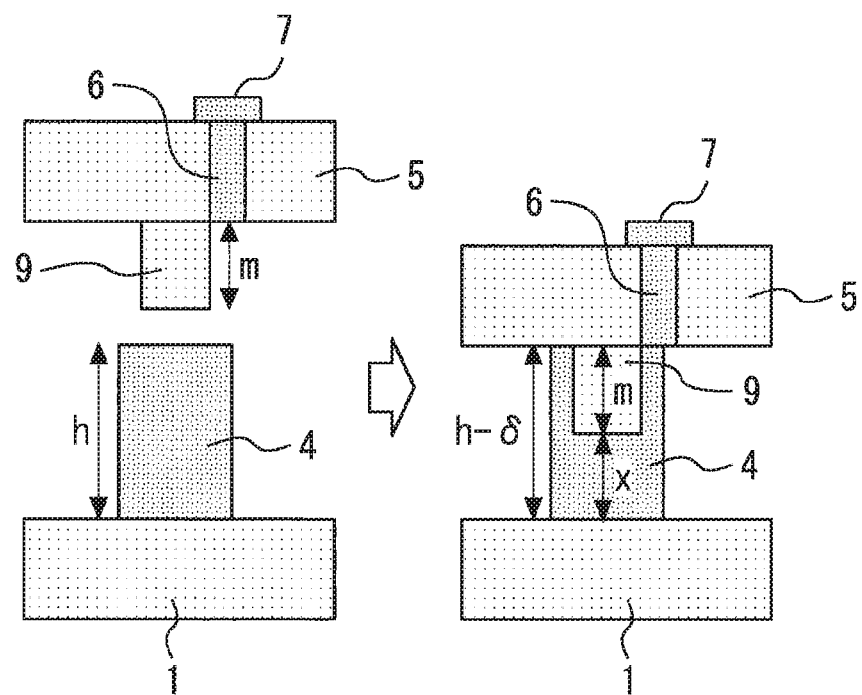
FIG. 6 is an enlarged cross-sectional view of a bump portion before and after the bonding.

FIG. 6 is an enlarged cross-sectional view of a bump portion before and after the bonding. The height m of the protrusion 9 and the height h of the bump 4 are selected appropriately so that the protrusion 9 is completely embedded in the bump 4 after the bonding. Thus the bump 4 can be electrically bonded to the via 6 reliably. The distance between the substrates becomes $h-\delta$ after the bonding.

The sealing frame 3, on the other hand, needs to satisfy the equation $0.3h \leq x \leq 0.6h$, where x is the length directly below the protrusion 8 in order to achieve the state of (b) or (c) described above. Since $m+x=h-\delta$, we have $0.4(h-\delta) \leq m \leq 0.7(h-\delta)$. Therefore, the height m of the protrusion 8 shall be 0.4 to 0.7 times the distance $h-\delta$ between the substrate 1 and the counter substrate 5 after the bonding.

Since the variation δ in the pattern height affects all parts of the sealing frame 3 and bumps 4 including the parts surrounding the protrusions 8 and 9, any variation will cause load distribution and necessitate a higher load. Therefore δ should most preferably be zero, or should be set to a minimum possible value within a range of 0≤δ, with a margin required for electrical bonding being also taken into account.

Figure 7:
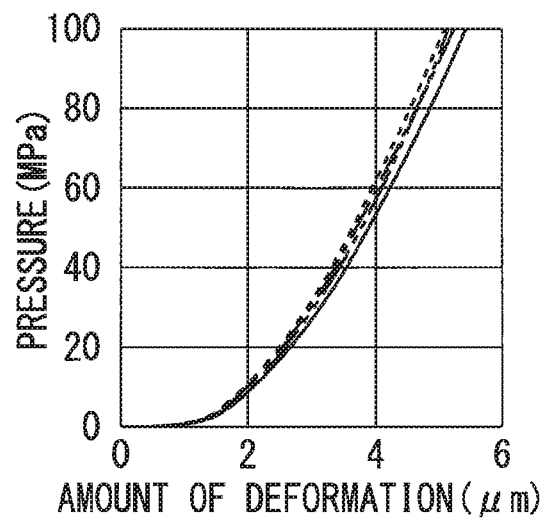
FIG. 7 is a graph that shows the relationship between the pressure applied to the Au paste and the amount of deformation.

When using an Au paste, for example, with a pattern height of 20 μm, the protrusion 8 may have a height of 6 μm to 14 μm, and the height after the bonding may be adjusted to about 20 μm. FIG. 7 is a graph that shows the relationship between the pressure applied to the Au paste and the amount of deformation. The measurements were made with the paste of 20 μm thickness, under a mom temperature environment. When 0≤δ≤1, for example, the protrusion 8 eventually receives a pressure of 100 MPa or more, and undergoes deformation of 10 μm. Meanwhile, the protrusion 9 receives a pressure of about 1 MPa or less, and undergoes deformation of no more than 1 μm. It follows that the applied bonding load will mostly be received by the protrusion 8 for the sealing frame 3.

In this embodiment, the substrates can be electrically connected by bumps 4. During the bonding, high pressure can be applied selectively and locally to the protrusion 8 rather than to the entire pattern area of the sealing frame 3. The height of the protrusion 8 is 0.4 to 0.7 times the distance between the substrate 1 and the counter substrate 5 after the bonding. Thus the metal paste of the sealing frame 3 can be transformed to bulk metal directly below the protrusion 8 so that the sealing properties can be improved.

The anchoring effect provided by the protrusions 8 and 9 allows the counter substrate 5 and the bumps 4 and sealing frame 3 to be bonded together with a favorable adhesion. The firm bond between the bumps 4 and the counter substrate 5 means a higher resistance to contact failures in electrical bonds resulting from substrate deformation and the like due to the device operations or the outer atmosphere.

Since it is the protrusion 8 whereby the seal is provided during the bonding, the sealing properties will be better if the protrusion 8 is wider, but too large a width will lead to insufficient loading during the bonding. The protrusion 8 needs to be designed in consideration of this trade-off and may have a width of about 5 μm to 10 μm, for example.

Figure 8:
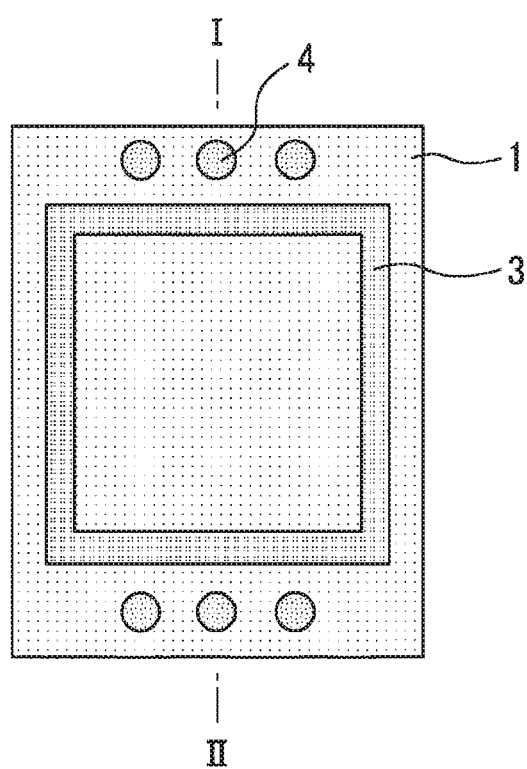
FIG. 8 is a cross-sectional view illustrating Variation Example 1 of the hollow sealed device according to Embodiment 1 of the present invention.
Figure 9:
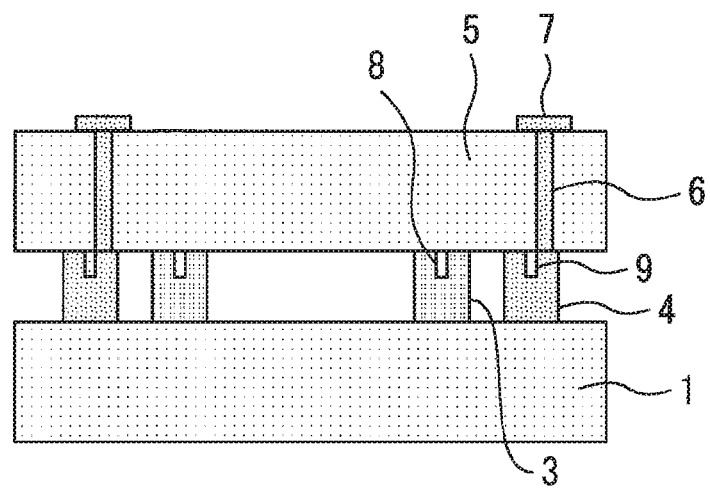
FIG. 9 is a cross-sectional view taken along I-II of FIG. 8.
Figure 10:
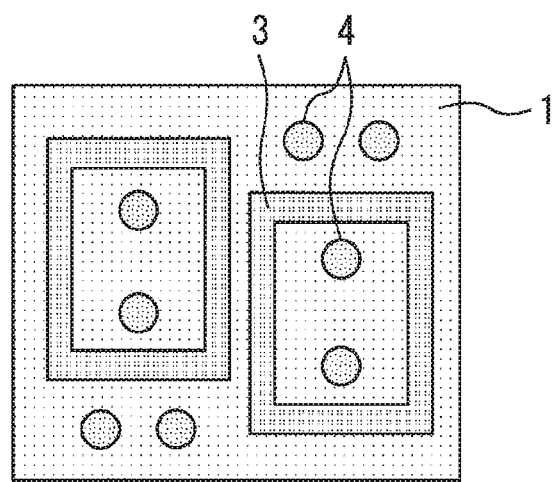
FIG. 10 is a cross-sectional view illustrating Variation Example 2 of the hollow sealed device according to Embodiment 1 of the present invention.

FIG. 8 is a cross-sectional view illustrating Variation Example 1 of the hollow sealed device according to Embodiment 1 of the present invention. FIG. 9 is a cross-sectional view taken along I-II of FIG. 8. FIG. 10 is a cross-sectional view illustrating Variation Example 2 of the hollow sealed device according to Embodiment 1 of the present invention. While the bumps 4 are located inside the sealing frame 3 in FIG. 1, the bumps 4 may be positioned outside the sealing frame 3 as shown in FIG. 8 to FIG. 10. As illustrated in FIG. 10, the sealing frame 3 and bumps 4 may be provided in any number per chip and in any arrangement.

Figure 11:
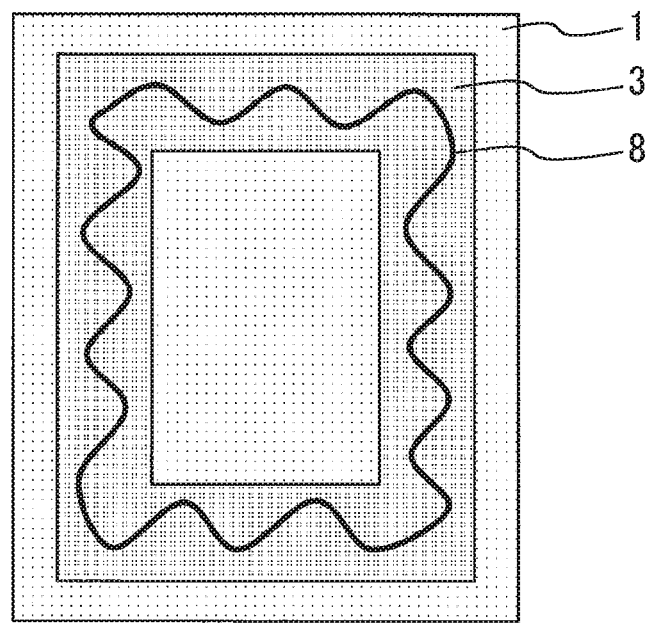
FIG. 11 is a plan view illustrating variation examples of the protrusion for the sealing frame of the hollow sealed device according to Embodiment 1 of the present invention.
Figure 12:
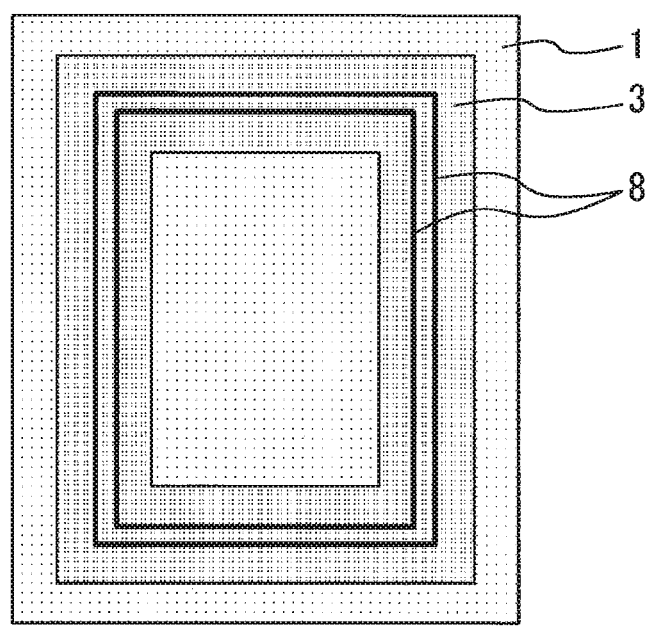
FIG. 12 is a plan view illustrating variation examples of the protrusion for the sealing frame of the hollow sealed device according to Embodiment 1 of the present invention.
Figure 13:
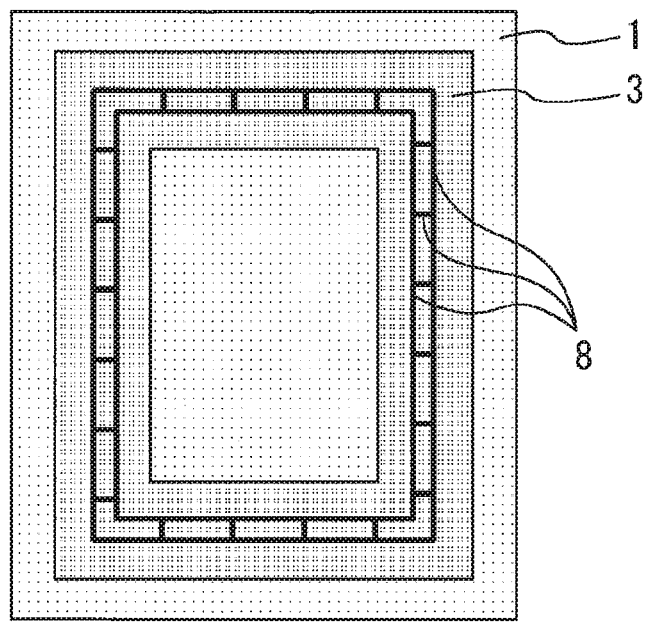
FIG. 13 is a plan view illustrating variation examples of the protrusion for the sealing frame of the hollow sealed device according to Embodiment 1 of the present invention.

FIG. 11 to FIG. 13 are plan views illustrating variation examples of the protrusion for the sealing frame of the hollow sealed device according to Embodiment 1 of the present invention. There are no limitations on the protrusion 8 for the sealing frame 3 except that it is a ring-like closed loop. Thus the protrusion may be formed in a meandering line as shown in FIG. 11, or in double lines as shown in FIG. 12, or in a pattern of partitioned double rings as shown in FIG. 13. These all allow a better airtightness to be achieved.

The shape of the protrusion 8 for the sealing frame 3 is not limited either, i.e., the protrusion may be cylindrical or square columnar.

Figure 14:
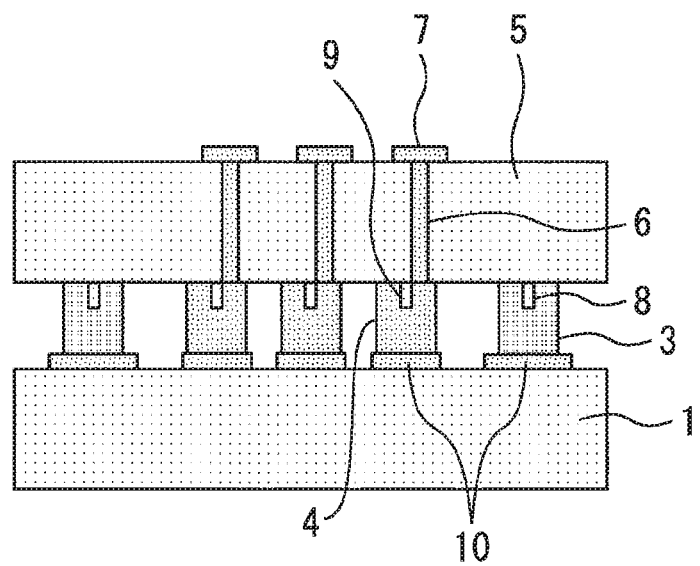
FIG. 14 is a cross-sectional view illustrating Variation Example 3 of the hollow sealed device according to Embodiment 1 of the present invention.

FIG. 14 is a cross-sectional view illustrating Variation Example 3 of the hollow sealed device according to Embodiment 1 of the present invention. A metal film 10 is formed on the substrate 1, and the sealing frame 3 and bumps 4 are formed on this metal film 10 by patterning a metal paste. This results in a favorable adhesion between the metal paste and the substrate 1.

Figure 15:
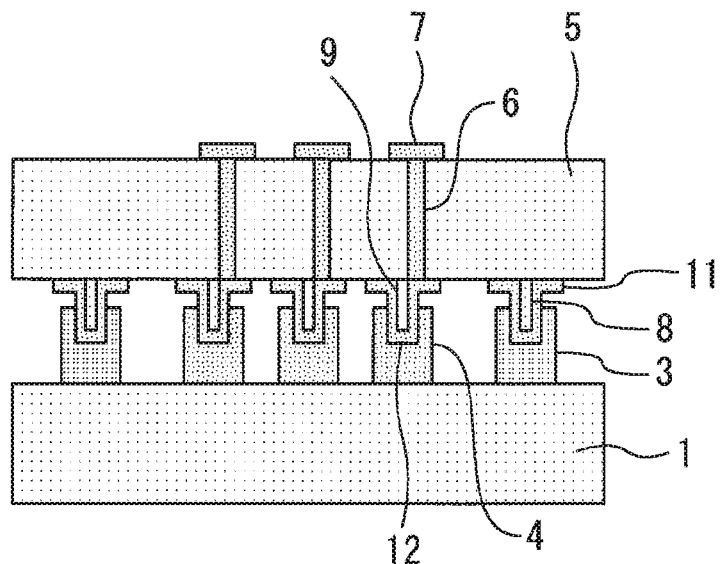
FIG. 15 is a cross-sectional view illustrating Variation Example 4 of the hollow sealed device according to Embodiment 1 of the present invention.
Figure 16:
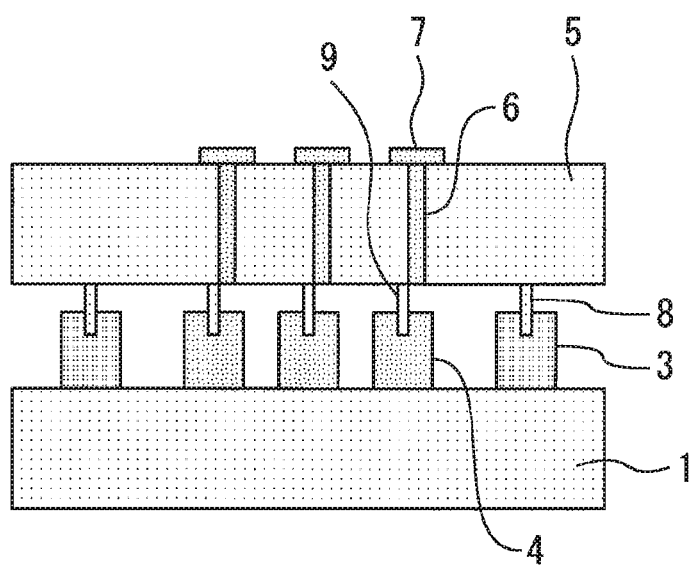
FIG. 16 is a cross-sectional view illustrating a hollow sealed device according to a comparative example.

FIG. 15 is a cross-sectional view illustrating Variation Example 4 of the hollow sealed device according to Embodiment 1 of the present invention. FIG. 16 is a cross-sectional view illustrating a hollow sealed device according to a comparative example. Insufficient deformation of the metal paste pattern of the sealing frame 3 and bumps 4 during the bonding results in poor adhesion between the sealing frame 3 and bumps 4 and the counter substrate 5 as shown in FIG. 16, in which case the bumps 4 cannot be connected to the vias 6. Therefore, a metal film 11 that covers the protrusion 8, and a metal film 12 that covers the protrusions 9 are formed on the lower surface of the counter substrate 5, as shown in FIG. 15. The protrusions 8 and 9 are bonded to the sealing frame 3 and the bumps 4 respectively via the metal films 11 and 12. This way, the adhesion between the sealing frame 3 and bumps 4 and the counter substrate 5 when they are bonded is made favorable. Since the metal film 12 is electrically connected to the vias 6, the bumps 4 can be electrically bonded to the vies 6 reliably via the metal film 12.

An outermost layer of the metal films 10 to 12, which makes contact with the metal paste, is made of the same material as the metal paste, or a rare metal resistant to surface oxidation, while a material that exhibits high adhesion with the base of the substrate 1 and others is used as the lowermost layer. For example, when the substrate 1 and counter substrate 5 are made of Si, the metal films 10 to 12 may be a 50 nm thick Ti film and a 200 nm thick Au film continuously formed upon one another. Patterning methods applicable for the metal films 10 to 12 include vapor deposition lift-off processes with resist patterning, and etching processes, wherein metal sputtering is followed by resist patterning and milling to remove unnecessary parts.

As one option, the substrate 1 and the counter substrate 5 may be prepared as wafers so that multiple devices are collectively bonded. Bonding conditions when Au metal paste is used include a temperature of 300° C. and a pressure of 100 MPa, for example. The higher the temperature and pressure, the better the bonding properties. A metal paste material made of nanoparticles or submicron particles of Au, Ag, Cu, Pd, or Pt dissolved in a solvent is used. Au, Ag, Cu, Pd, and Pt have a good electrical conductivity so that the bumps 4 can have a good electrical conductivity. Au, Pd, and Pt in particular have a low reactivity and are resistant to modification such as surface oxidation so that they turn into bulk in a favorable manner when bonded, meaning that they have favorable characteristics as a material for providing an airtight seal. In order to achieve a favorable adhesion with the bonding interface, it is preferable to subject the metal to an Ar plasma or $O_2$ plasma process prior to bonding.

Embodiment 2

Figure 17:
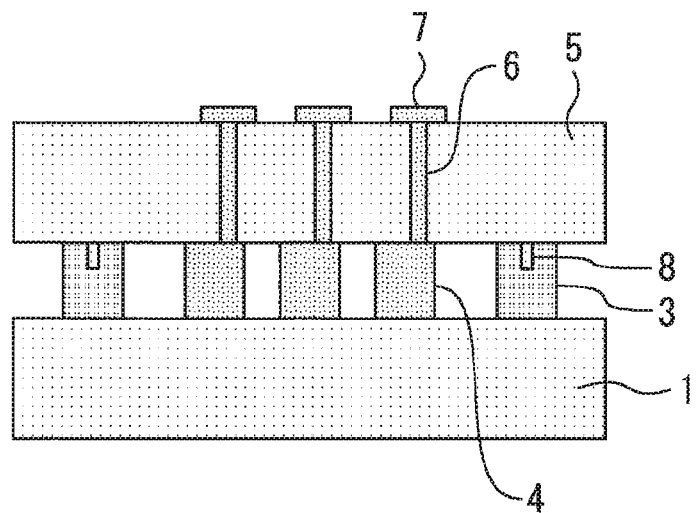
FIG. 17 is a cross-sectional view illustrating a hollow sealed device according to Embodiment 2 of the present invention.

FIG. 17 is a cross-sectional view illustrating a hollow sealed device according to Embodiment 2 of the present invention. Unlike Embodiment 1, the protrusions 9 to be bonded to the bumps 4 are not provided. Therefore, an even higher load can be applied to the protrusion 8 that is bonded to the sealing frame 3, so that the sealing properties can be enhanced even more. Moreover, while the protrusions 9 have to be arranged such as not to overlap the vias 6 in Embodiment 1, this embodiment need no such consideration in the layout. The degree of freedom in the layout is thus increased, whereby an increase in the area required for the layout can be prevented.

Figure 18:
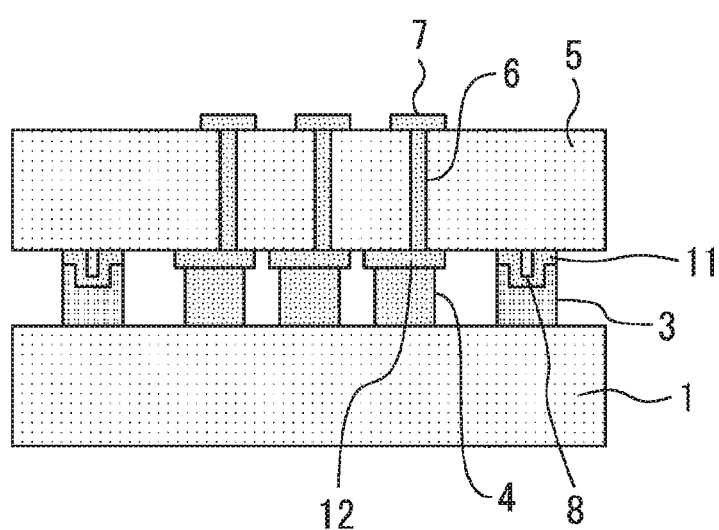
FIG. 18 is a cross-sectional view illustrating a variation example of the hollow sealed device according to Embodiment 2 of the present invention.

FIG. 18 is a cross-sectional view illustrating a variation example of the hollow sealed device according to Embodiment 2 of the present invention. A metal film 11 that covers the protrusion 8, and a metal film 12 electrically connected to the vies 6 of the counter substrate 5 are formed on the lower surface of the counter substrate 5. The protrusion 8 is bonded to the sealing frame 3 via the metal film 11, and the bumps 4 are electrically bonded to the vias 6 via the metal film 12. This allows a favorable adhesion to be achieved between the metal paste pattern and the counter substrate 5 when bonded, and allows the bumps 4 to be electrically bonded to the vias 6 reliably.

Embodiment 3

Figure 19:
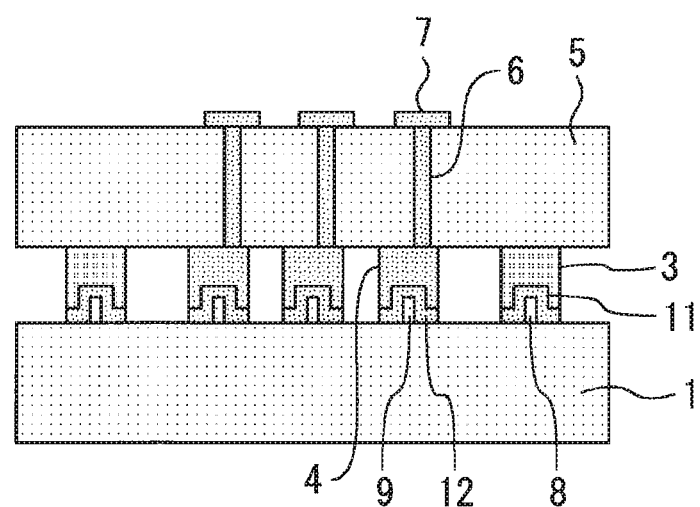
FIG. 19 is a cross-sectional view illustrating a hollow sealed device according to Embodiment 3 of the present invention.

FIG. 19 is a cross-sectional view illustrating a hollow sealed device according to Embodiment 3 of the present invention. In this embodiment, the protrusions 8 and 9 are formed on the substrate 1. In this case, too, a high pressure can be applied selectively and locally to the protrusions 8 and 9 similarly to Embodiment 1, so that the sealing properties can be improved. Also, the pressure to be applied is determined relative to the amount by which the metal paste pattern is pressed down, similarly to Embodiment 1.

REFERENCE SIGNS LIST

1 substrate; 3 sealing frame; 4 bump; 5 counter substrate; 6 via; 8,9 protrusion; 11,12 metal film

The invention claimed is:

1. A method for manufacturing a hollow sealed device comprising:
    forming a ring-like sealing frame and a bump simultaneously on a main surface of a first substrate by patterning a metal paste;
    forming a ring-like protrusion having a smaller width than a width of the sealing frame on a main surface of a second substrate;
    forming a first metal film covering the protrusion and a second metal film electrically connected to a via of the second substrate on the main surface of the second substrate;
    aligning the main surface of the first substrate and the main surface of the second substrate to face each other, bonding the sealing frame to the protrusion via the first metal film, and electrically bonding the bump to the second substrate; and
    electrically bonding the bump to the via the second metal film,
    wherein a height of the protrusion is 0.4 to 0.7 times a distance between the first substrate and the second substrate bonded to each other, and
    in the sealing frame after bonding, at least directly below the protrusion, gaps between metal particles are isolated or the metal particles turn completely into bulk.

2. The method for manufacturing a hollow sealed device according to claim 1, further comprising:
    forming an other metal film on the main surface of the first substrate; and
    forming the sealing frame and the bump on the other metal film.

3. A method for manufacturing a hollow sealed device comprising:
    forming a ring-like sealing frame and a bump simultaneously on a main surface of a first substrate by patterning a metal paste;
    forming a ring-like first protrusion having a smaller width than a width of the sealing frame and a second protrusion having a smaller width than a width of the bump on a main surface of a second substrate;
    forming a first metal film covering the first protrusion and a second metal film covering the second protrusion on the main surface of the second substrate;
    aligning the main surface of the first substrate and the main surface of the second substrate to face each other, bonding the sealing frame to the first protrusion via the first metal film, bonding the bump to the second protrusion, and electrically bonding the bump to the second substrate; and
    bonding the second protrusion to the bump via the second metal film,
    wherein a height of the first protrusion is 0.4 to 0.7 times a distance between the first substrate and the second substrate after bonding, and
    in the sealing frame after bonding, at least directly below the first protrusion, gaps between metal particles are isolated or the metal particles turn completely into bulk.

4. The method for manufacturing a hollow sealed device according to claim 3, wherein the second protrusion is completely embedded in the bump.

5. The method for manufacturing a hollow sealed device according to claim 3, further comprising electrically bonding the second metal film to a via of the second substrate.

6. The method for manufacturing a hollow sealed device according to claim 3, further comprising:
    forming an other metal film on the main surface of the first substrate; and
    forming the sealing frame and the bump on the other metal film.

7. A hollow sealed device comprising:
    a first substrate;
    a ring-like sealing frame provided on a main surface of a first substrate;
    a bump provided on the main surface of the first substrate;
    a second substrate having a main surface opposite to the main surface of a first substrate;
    a ring-like protrusion provided on the main surface of the second substrate and having a smaller width than a width of the sealing frame;
    a first metal film covering the protrusion; and
    a second metal film electrically connected to a via of the second substrate on the main surface of the second substrate,
    wherein the sealing frame is bonded to the protrusion via the first metal film,
    the bump is electrically bonded to the second substrate,
    the bump is electrically bonded to the via the second metal film,
    a height of the protrusion is 0.4 to 0.7 times a distance between the first substrate and the second substrate,
    the sealing frame and the bump are formed of a metal paste, and
    in the sealing frame, at least directly below the protrusion, gaps between metal particles are isolated or the metal particles have turned completely into bulk.

8. A hollow sealed device comprising:
a first substrate;
a ring-like sealing frame provided on a main surface of a first substrate;
a bump provided on the main surface of the first substrate;
a second substrate having a main surface opposite to the main surface of a first substrate;
a ring-like first protrusion provided on the main surface of the second substrate and having a smaller width than a width of the sealing frame;
a first metal film covering the first protrusion;
a second protrusion provided on the main surface of the second substrate and having a smaller width than a width of the bump; and
a second metal film covering the second protrusion on the main surface of the second substrate,
wherein the sealing frame is bonded to the first protrusion via the first metal film,
the bump is bonded to the second protrusion via the second metal film,
the bump is electrically bonded to the second substrate,
a height of the first protrusion is 0.4 to 0.7 times a distance between the first substrate and the second substrate,
the sealing frame and the bump are formed of a metal paste, and
in the sealing frame, at least directly below the first protrusion, gaps between metal particles are isolated or the metal particles have turned completely into bulk.

* * * * *